United States Patent
Song et al.

(10) Patent No.: US 8,799,847 B1
(45) Date of Patent: Aug. 5, 2014

(54) METHODS FOR DESIGNING FIN-BASED FIELD EFFECT TRANSISTORS (FINFETS)

(71) Applicant: QUALCOMM Incorporated, San Diego, CA (US)

(72) Inventors: Stanley Seungchul Song, San Diego, CA (US); Zhongze Wang, San Diego, CA (US); Choh fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/838,462

(22) Filed: Mar. 15, 2013

(51) Int. Cl.
*G06F 17/50* (2006.01)
(52) U.S. Cl.
CPC ................ *G06F 17/5068* (2013.01)
USPC ............... 716/122; 716/119; 716/132
(58) Field of Classification Search
CPC ............ G06F 17/50–17/5081; H01L 21/8232–21/823892; H01L 29/772–29/2856
See application file for complete search history.

(56) References Cited

U.S. PATENT DOCUMENTS

| 7,847,320 B2 | 12/2010 | Anderson et al. |
| 8,174,868 B2 | 5/2012 | Liaw |
| 2008/0050897 A1 | 2/2008 | Kottantharayil |
| 2010/0287518 A1 | 11/2010 | Becker |
| 2012/0280331 A1 | 11/2012 | Ou et al. |
| 2013/0126978 A1* | 5/2013 | Becker et al. ............... 257/369 |
| 2013/0207199 A1* | 8/2013 | Becker et al. ............... 257/369 |

OTHER PUBLICATIONS

Chen, Tze-Chiang, "Challenges for silicon technology scaling in the Nanoscale Era," Proceedings of ESSCIRC, Sep. 14-18, 2009, Athens, Greece, IEEE, 7 pages.
Keshavarzi, A. et al., "Architecting Advanced Technologies for 14nm and Beyond with 3D FinFET Transistors for the Future SoC Applications," 2011 IEEE International Electron Devices Meeting, Dec. 5-7, 2011, Washington, DC, IEEE, 4 pages.
International Search Report and Written Opinion for PCT/US2014/024174 mailed Jun. 11, 2014, 14 pages.

* cited by examiner

*Primary Examiner* — Leigh Garbowski
(74) *Attorney, Agent, or Firm* — Withrow & Terranova, PLLC

(57) ABSTRACT

Methods for designing fin-based field effect transistors (Fin-FETs) are disclosed. In one embodiment, an initial FinFET design is evaluated to ascertain the space between fins (i.e., the "fin pitch"). Additionally, the spacing between interconnect metal modules (i.e., the "metal pitch") is ascertained. A ratio of metal pitch to fin pitch is established. From this initial ratio, isotropically scaled sizes are considered along with anisotropically scaled sizes. The variously scaled sizes are compared to design criteria to see what new size best fits the design criteria.

19 Claims, 10 Drawing Sheets

METHODS FOR DESIGNING FIN-BASED FIELD EFFECT TRANSISTORS (FINFETS)

BACKGROUND

I. Field of the Disclosure

The technology of the disclosure relates generally to circuit design, and more particularly to designing fin-based field effect transistors (FinFETs).

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. These and other factors contribute to a continued miniaturization of components within the circuitry.

Miniaturization of the components impacts all aspects of the processing circuitry including the memory transistors and other reactive elements in the processing circuitry. While miniaturization of components in mobile communication devices is easy for the consumer to appreciate as phones become smaller and lighter and have longer battery times, miniaturization pressures are not limited to mobile communication devices. Computing devices ranging from mobile communication devices to desktop computers to servers and the like all benefit from miniaturization efforts. In particular, almost all of these devices have various forms of memory which may include field effect transistors (FETs) including possibly FETs with fins, or FinFETs.

A FinFET has a series of fins on a first layer and a series of metal interconnections on upper layers. The metal interconnections allow for electrical connections to be made between active components of the integrated circuit that include the FinFET. The spacing between fins plus fin width of a FinFET is called the fin pitch. Likewise, the metal interconnections are implemented in modular components that have a certain width and space. The modular component width and space combined may be referred to as a metal pitch. For example, current FinFET designs may rely on designs that use a 3:4 metal pitch to fin pitch ratio.

As FinFETs are miniaturized, it may be difficult to retain the current metal pitch to fin pitch ratios while still meeting other process and design criteria such as cost effective fin and metal patterning process, metal width, metal space, and fin height or the like. Accordingly, there needs to be a new way to design smaller FinFETs.

SUMMARY OF THE DISCLOSURE

Embodiments disclosed in the detailed description include methods for designing fin-based field effect transistors (FETs) (FinFETs). In particular an initial FinFET design is evaluated to ascertain the space between fins plus fin width (i.e. the "fin pitch"). Additionally, the spacing between interconnect metal modules plus metal width (i.e., the "metal pitch") is ascertained. A ratio of metal pitch to fin pitch is established. From this initial ratio, isotropically scaled sizes are considered along with anisotropically scaled sizes. Given the definition of isotropic, scaling isotropically maintains the existing metal pitch to fin pitch ratio (e.g., if the initial ratio is 3:4, any isotropically scaled size will also maintain the 3:4 ratio). Conversely, given the definition of anisotropic, scaling anisotropically changes the existing metal pitch to fin pitch ratio (e.g., if the initial ratio is 3:4, an anisotropically scaled ratio might be, for example, 5:6, 3:5, 2:3, 11:17 or the like). The variously scaled sizes are compared to desired design criteria such as cell height, fin width, fin space, metal width and metal space, or the like to determine what new size best fits the design criteria.

In this regard in one embodiment, a method of designing a FinFET is disclosed. The method comprises determining a starting point ratio between a metal pitch and a fin pitch for a starting FinFET design. The method also comprises evaluating an isotropically scaled ratio for a smaller FinFET design, the isotropically scaled ratio having at least a first design characteristic (e.g., cell height, fin width, fin space, metal width and metal space, or the like). The method also comprises evaluating at least one anisotropically scaled ratio for the smaller FinFET design, the anisotropically scaled ratio having at least a second design characteristic. The method also comprises comparing the first and second design characteristics to at least a threshold design characteristic. The method also comprises selecting a new ratio of metal pitch to fin pitch for the FinFET based on the comparison to the threshold design characteristic.

In another embodiment, a method of designing a FinFET is disclosed. The method comprises a step for determining a starting point ratio between a metal pitch and a fin pitch for a starting FinFET design. The method also comprises a step for evaluating an isotropically scaled ratio for a smaller FinFET design, the isotropically scaled ratio having at least a first design characteristic. The method also comprises a step for evaluating at least one anisotropically scaled ratio for the smaller FinFET design, the anisotropically scaled ratio having at least a second design characteristic. The method also comprises a step for comparing the first and second design characteristics to at least a threshold design characteristic. The method also comprises a step for selecting a new ratio for the FinFET based on the comparison to the threshold design characteristic.

In another embodiment, a computer-readable medium having stored thereon computer executable instructions is disclosed. The instructions cause a processor to determine a starting point ratio between a metal pitch and a fin pitch for a starting FinFET design. The instructions also cause a processor to evaluate an isotropically scaled ratio for a smaller FinFET design, the isotropically scaled ratio having at least a first design characteristic. The instructions also cause a processor to evaluate at least one anisotropically scaled ratio for the smaller FinFET design, the anisotropically scaled ratio having at least a second design characteristic. The instructions also cause a processor to compare the first and second design characteristics to at least a threshold design characteristic. The instructions also cause a processor to select a new ratio for the FinFET based on the comparison to the threshold design characteristic.

BRIEF DESCRIPTION OF THE FIGURES

FIGS. 4A and 4B are exemplary lookup tables for use in the process of FIG. 3;

DETAILED DESCRIPTION

Figure 1A:
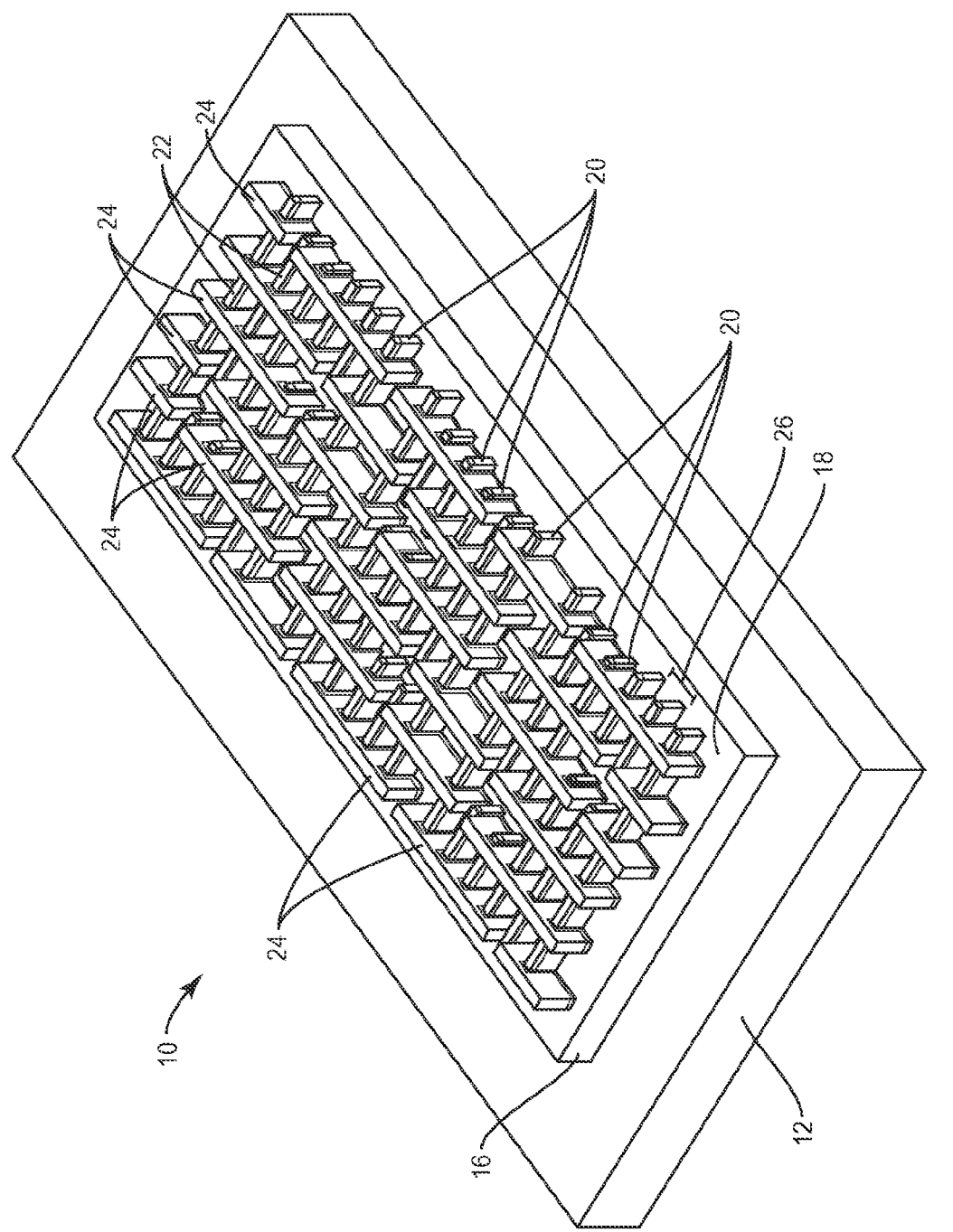
FIG. 1A is a perspective view of an exemplary conventional fin-based field effect transistor (FinFET)

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include methods for designing fin-based field effect transistors (FETs) (FinFETs). In particular an initial FinFET design is evaluated to ascertain the space between fins plus fin width (i.e., the "fin pitch"). Additionally, the spacing between interconnect metal modules plus metal width (i.e., the "metal pitch") is ascertained. A ratio of metal pitch to fin pitch is established. From this initial ratio, isotropically scaled sizes are considered along with anisotropically scaled sizes. Given the definition of isotropic, scaling isotropically maintains the existing metal pitch to fin pitch ratio (e.g., if the initial ratio is 3:4, any isotropically scaled size will also maintain the 3:4 ratio). Conversely, given the definition of anisotropic, scaling anisotropically changes the existing metal pitch to fin pitch ratio (e.g., if the initial ratio is 3:12, an anisotropically scaled ratio might be, for example, 5:6, 3:5, 2:3 11:17 or the like). The variously scaled sizes are compared to desired design criteria such as cell height, fin width, metal width and metal space, or the like to determine what new size best fits the design criteria.

Figure 1B:
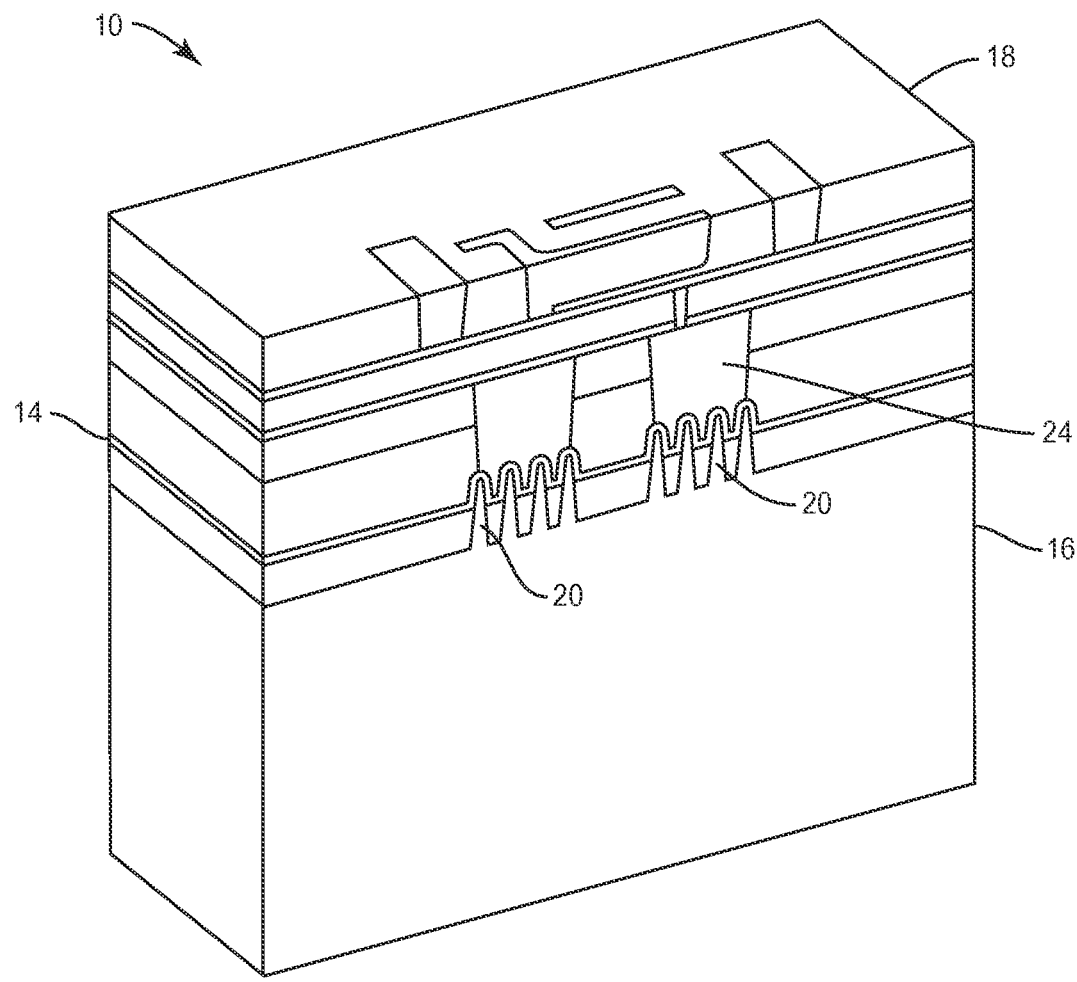
FIG. 1B is a cross-sectional view of the FinFET of FIG. 1 with a metal layer associated therewith.
Figure 2:
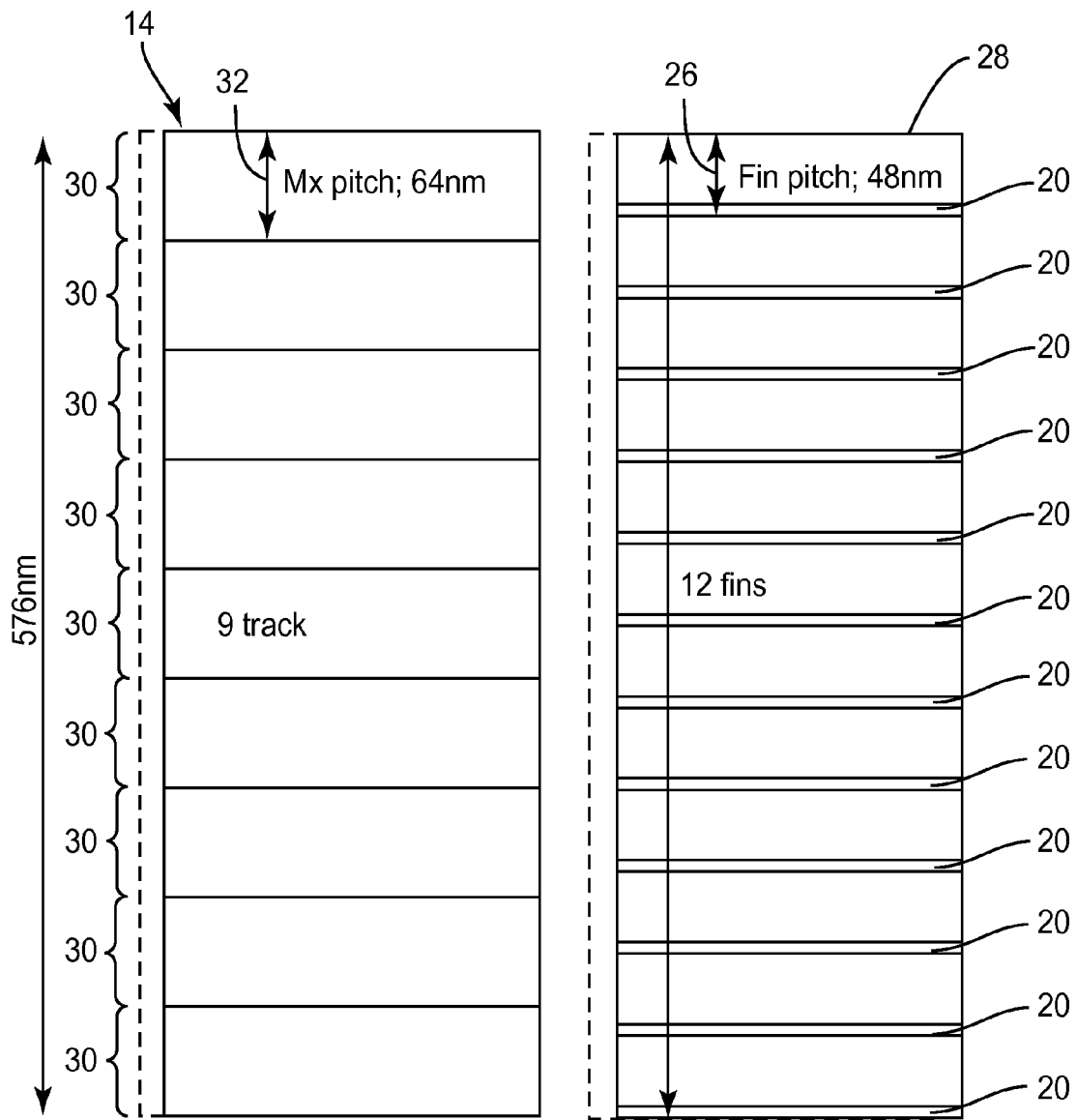
FIG. 2 is a simplified schematic illustrating a metal pitch relative to a fin pitch in a FinFET.

Before addressing the concepts of embodiments of the present disclosure, a brief overview of a conventional FinFET is provided with reference to FIGS. 1A, 1B, and 2. Against the backdrop of a conventional FinFET, embodiments of methods for designing FinFETs are provided beginning at FIG. 3.

In this regard, FIG. 1A is a perspective view of an embodiment of a conventional FinFET 10 and FIG. 1B is a cross-sectional view with a metal layer added. FinFET 10 is positioned on a substrate 12. Metal layer 14 (FIG. 1B only) provides interconnections between different elements of the FinFET 10 and may also connect the FinFET 10 to other components in an integrated circuit (not shown). An active region 16 may be positioned on the substrate 12 and form one or more source and drains (not shown) for the FinFET 10. The active region 16 may include an oxide layer (not shown) on an upper surface 18 that provides insulation between the elements of the FinFET 10. Fins 20 may be formed on the upper surface 18. A nitride layer 22 may be formed on an upper surface of the fins 20. The nitride layer 22 protects the fins 20 from undesired oxidation. Note that the nitride layer 22 is an optional layer. Gates 24 are formed across one or more fins 20 as is well understood. As is understood, the distinguishing characteristic of the FinFET 10 from other types of FETs is that the conducting channel is wrapped by a thin silicon "fin" (i.e., fin 20), which forms the body of the device. The thickness of the fin (measured in the direction from source to drain) determines the effective channel length of the device which controls an operating profile of the device.

With continued reference to FIG. 1A, there is a spacing between the fins 20. In particular, the distance 26 between equivalent edges of the fin 20 is defined to be the "fin pitch." In this example, the distance is defined as the distance from the left edge of a fin 20 to the left edge of an adjacent fin 20. Equivalently, the fin pitch may be the distance from the right edge to the adjacent right edge. In exemplary conventional FinFETs (e.g., FinFET 10), the fin pitch may be forty-eight nanometers (48 nm). Similarly, there is a "metal pitch" (not illustrated in FIG. 1A or 1B) which defines the distance between equivalent edges of tracks within the metal layer 14. The metal pitch:fin pitch ratio determines a cell height. Thus, manipulation of the pitch ratio allows optimization for the most efficient cell height.

In this regard, FIG. 2 illustrates the metal layer 14 and a conceptual fin layer 28. The metal layer 14 has tracks 30, which are duplicated across the dimensions of the metal layer 14. The distance 32 between equivalent edges of the tracks 30 is the metal pitch. In an exemplary conventional embodiment, the metal layer 14 has a length of 576 nm with each metal pitch being sixty-four (64) nm, or nine tracks 30. Given that the conceptual fin layer 28 takes the same dimensions as the dimensions of the metal layer 14, the conceptual fin layer 28 also has a length of 576 nm, with each fin pitch being forty-eight (48) nm, or twelve (12) fins. Thus, the ratio of metal pitch to fin pitch in this embodiment is nine:twelve (9:12), or further simplified to 3:4.

Figure 3:
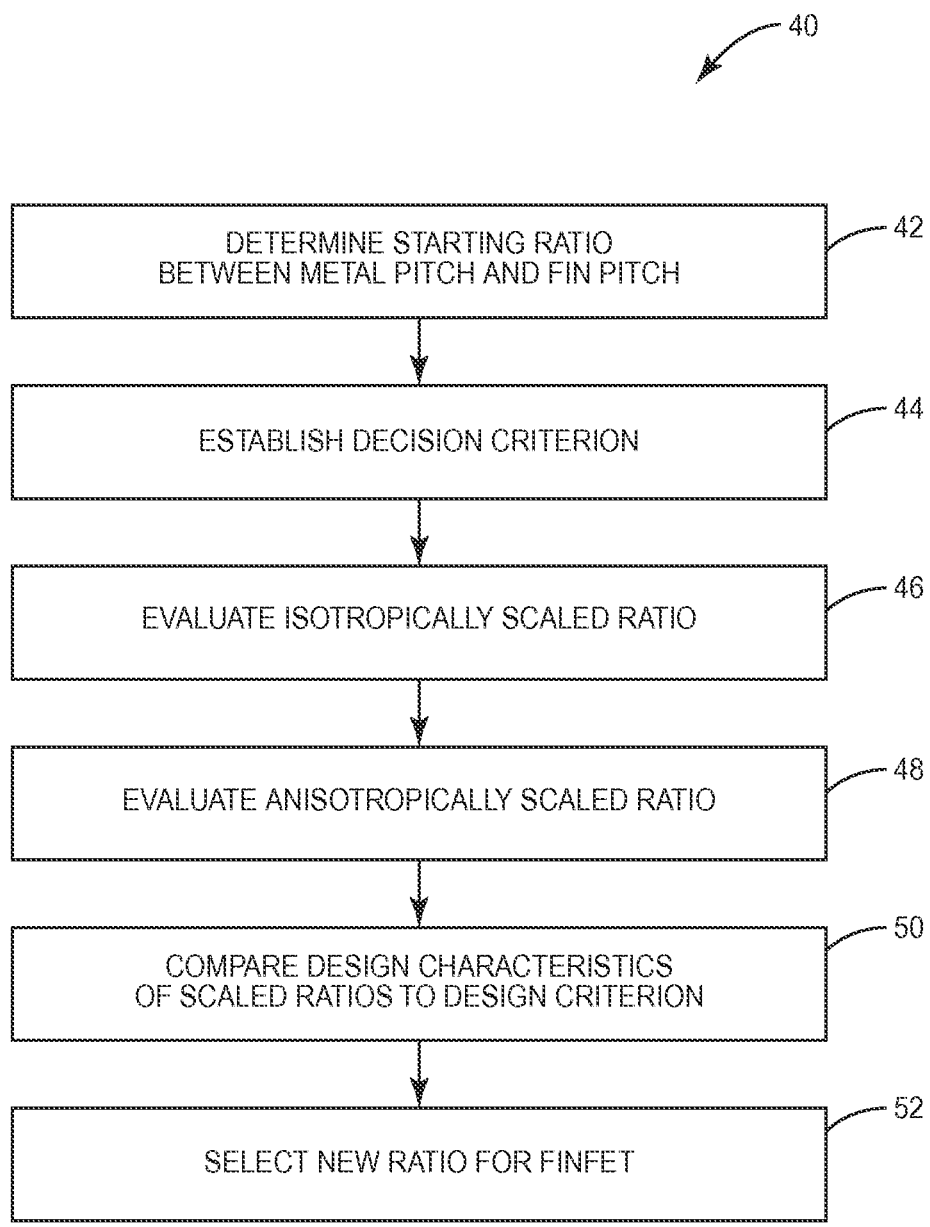
FIG. 3 is a flow chart illustrating an exemplary process through which FinFETs may be designed.

Against this general explanation of conventional FinFET 10, FIG. 3 illustrates a flow chart associated with an exemplary process 40 of designing new FinFETs. In particular, the process allows for new (and smaller) FinFETs to be designed in such a manner that it is relatively easy to ascertain whether a potential FinFET design meets predefined design criteria. The process 40 begins with determining a starting ratio between a metal pitch and a fin pitch for an existing FinFET design (block 42). For example, if the conventional FinFET 10 is used as the starting point, the starting ratio may be 9 tracks:12 tracks. That is, there are nine metal layer modules for the twelve fins. Given that the size of the cell is known, dividing the size of the cell by the number of fins or modules gives the fin pitch and metal pitch. Note that the ratio of 9:12 may be expressed as a ratio of 3:4. Note that if 3:4 is the starting ratio, then to move the starting ratio of 3:4 to the 9:12 actual tracks, a number is multiplied by both the antecedent and the consequent of the ratio. In this example, the number is three (i.e., three multiplied by three is 9 tracks and three multiplied by four is 12 tracks). The number that is multiplied by both the antecedent and consequent is called herein the "least common multiplier."

With continued reference to FIG. 3, after determining the starting ratio and possibly the least common multiplier, a new design criterion is established (block 44). Various exemplary design criteria are FET channel length, channel width, cell height, fin pitch, metal pitch, leakage current, maximum current, maximum voltage, bias voltage, fin width, fin spacing, metal width, and metal spacing. These design criteria may be relevant for any number of reasons relating to the intended use of the new FinFET or may be a function of intended physical constraints within an intended use for the new FinFET. In an exemplary embodiment, a single design criterion is established, but the disclosure is not so limited and a plurality of design criteria may be used.

Figure 4A:
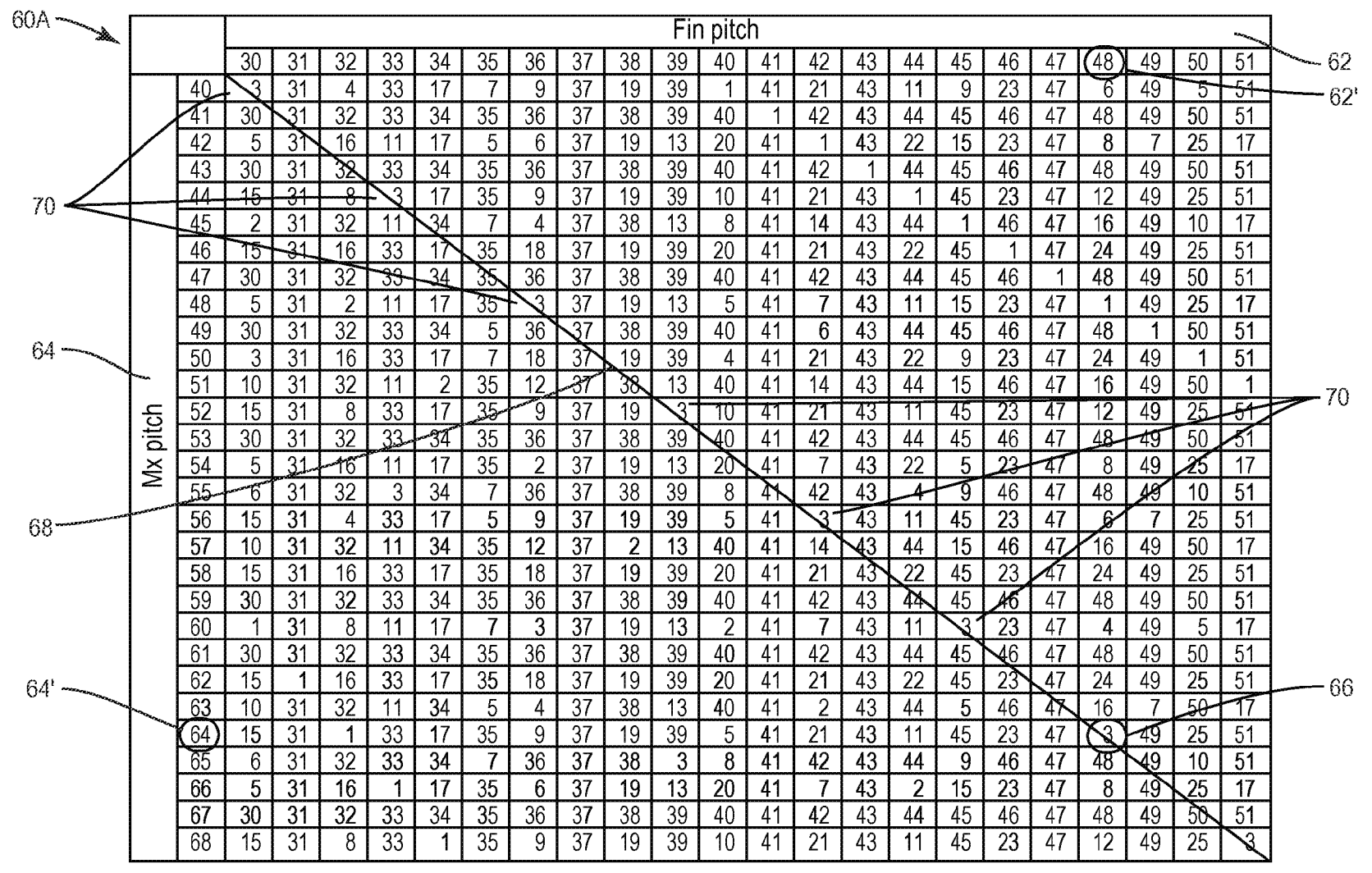
Figure 4B:
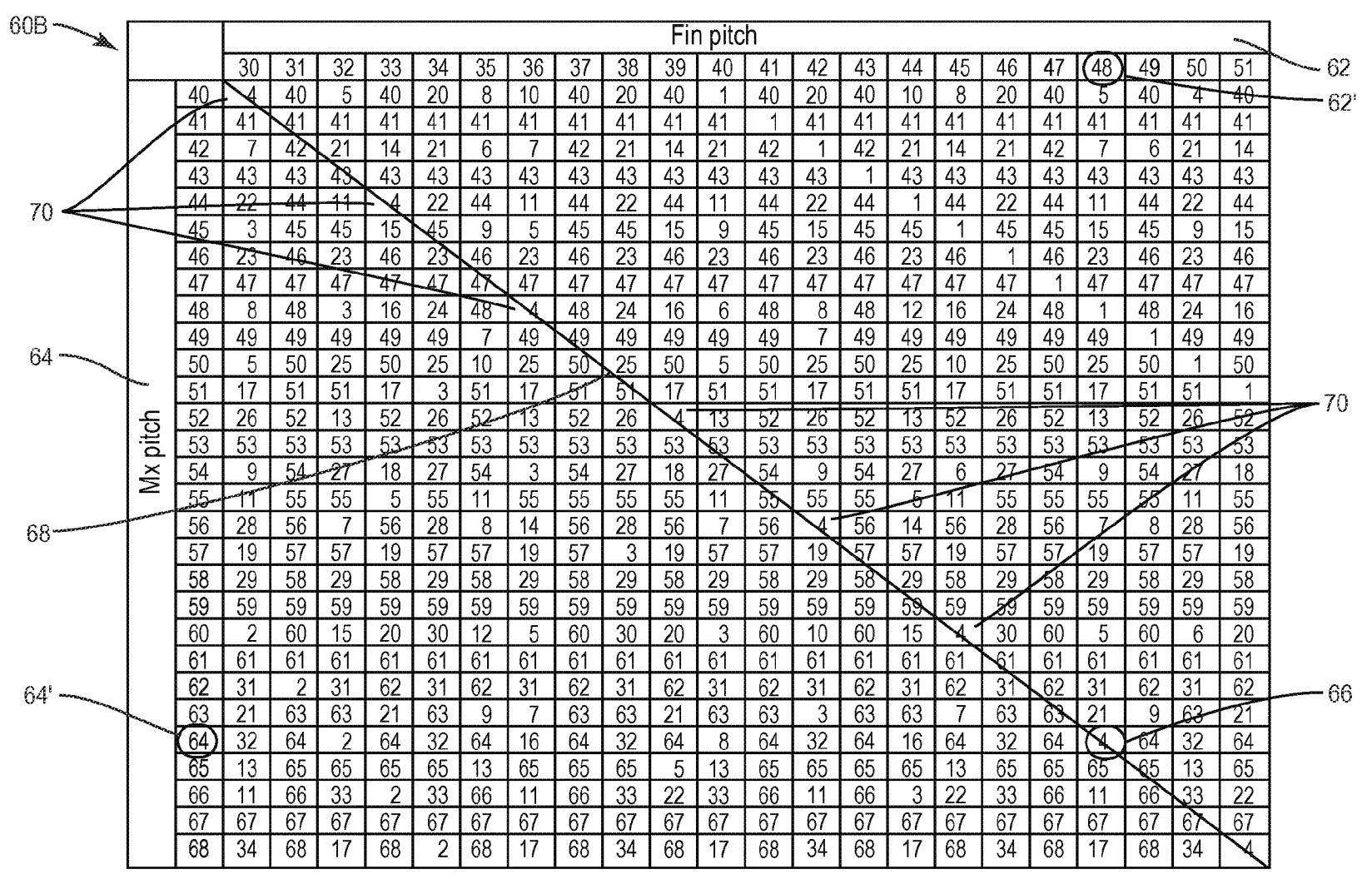

With continuing reference to FIG. 3, the design process 40 continues by finding prospective new sizes by evaluating an isotropically scaled ratio (block 46) to see how well the prospective matches or meets the threshold design criterion. In an exemplary embodiment, a look up table may be used find these prospective new sizes such as look up tables 60A and 60B in FIGS. 4A and 4B. While two look up tables 60A, 60B are illustrated, it should be appreciated that in an alternate exemplary embodiment (e.g., a computer-implemented embodiment), the look up tables 60A, 60B may be a single table. The look up tables 60A, 60B include a fin pitch on the x-axis 62 and a metal pitch on the y-axis 64. That is, the x-axis represents a number of nanometers for a fin pitch (e.g., 62' has a value of 48 corresponding to forty-eight (48) nm of a fin pitch). The y-axis represents a number of nanometers for a metal pitch (e.g., 64' has a value of sixty-four (64) nm of a metal pitch). The entries on the look up tables 60A and 60B are the ratio values stripped of the least common multipliers.

To read the look up table 60A, the fin pitch is found on the x-axis 62 and then the column is read downwardly until the metal pitch is found on the y-axis 64. Alternatively, the metal pitch is found on the y-axis 64 and then the row is read across until the fin pitch is found on the x-axis 62. Continuing use of the FinFET 10 of FIGS. 1A, 1B, the fin pitch is forty-eight (48) nm, corresponding to 62' on the x-axis 62 and the metal pitch is sixty-four (64) nm, corresponding to 64' on the y-axis. The cell 66 corresponding to the ratio reveals the term for the ratio. Thus, the elements of look up table 60A provide the terms for the fin pitch portion of the ratio and the elements of look up table 60B provide the terms for the metal pitch portion of the ratio. Thus, cell 66 is a "3" in look up table 60A and a "4" in look up table 60B. Combining the terms into a formal ratio provides the 3:4 ratio for FinFET 10.

Returning to process 40 in FIG. 3, a designer (or software being used by a designer) may evaluate an isotropically scaled ratio for a FinFET design (block 46). In an exemplary embodiment, the scaled ratio is for a smaller FinFET design that may meet miniaturization goals. With reference to the look up table 60A of FIG. 4A, the isotropically scaled ratios lie on a line 68 and pass through other cells 70 having a value of three. Each of the cells becomes a possible new design having respective design characteristics such as a different fin pitch or metal pitch. A specific fin pitch may dictate a size or width of a fin, which in turn may affect channel length, threshold voltage or other design criteria. Reading up to the x-axis 62, a new dimension for the fin pitch is ascertained. Reading across to the y-axis 64, a new dimension for the metal pitch is ascertained. The process is repeated using the look up table 60B of FIG. 4B, finding the same cell on both look up tables 60A, 60B. As would be understood, the sizes of the pitches are design characteristics. Thus, based on the evaluation of the isotropically scaled ratio, one or more possible isotropically scaled design choices are identified, each having various design characteristics.

Returning to the process 40 in FIG. 3, a designer (or software being used by a designer) may evaluate an anisotropically scaled ratio for a FinFET design (block 48). By expanding the evaluation of fin pitch to metal pitch ratios beyond what are available from isotropic scaling, the designer may find a design that better meets the predefined design characteristics. In an exemplary embodiment, the scaled ratio is for a smaller FinFET design to meet miniaturization goals. With reference to the look up table 60A of FIG. 4A, the anisotropically scaled ratios lie anywhere other than on line 68. Each of the cells having the same term becomes a possible new design having respective design characteristics. Reading up to the x-axis 62, a new dimension for the fin pitch is ascertained. Reading across to the y-axis 64, a new dimension for the metal pitch is ascertained. The process is repeated on the look up table 60B of FIG. 4B. As would be understood, the sizes of the pitches are design characteristics. Thus, based on the evaluation of the anisotropically scaled ratio, one or more anisotropically scaled design choices are identified, each having various design characteristics.

Returning to the process 40 in FIG. 3, the designer (or the software) compares design characteristics of the isotropically scaled design choices and the anisotropically scaled design choices to the design criterion to see if the design characteristic of a given design choice meets the desired threshold (block 50). Based on how well the design choice meets or exceeds the desired threshold a new ratio is selected (block 52). Note that while the isotropically scaled ratios are considered first in FIG. 3, the present disclosure is not so limited, and the anisotropically scaled ratios may be considered before the isotropically scaled ratios without departing from the scope of the present disclosure.

Note that the process 40 may be implemented in a non-transitory computer readable medium with instructions for a computer processor to assist in the selection of the design options and comparing the design characteristics of the design options to the design characteristic threshold.

Figure 5A:
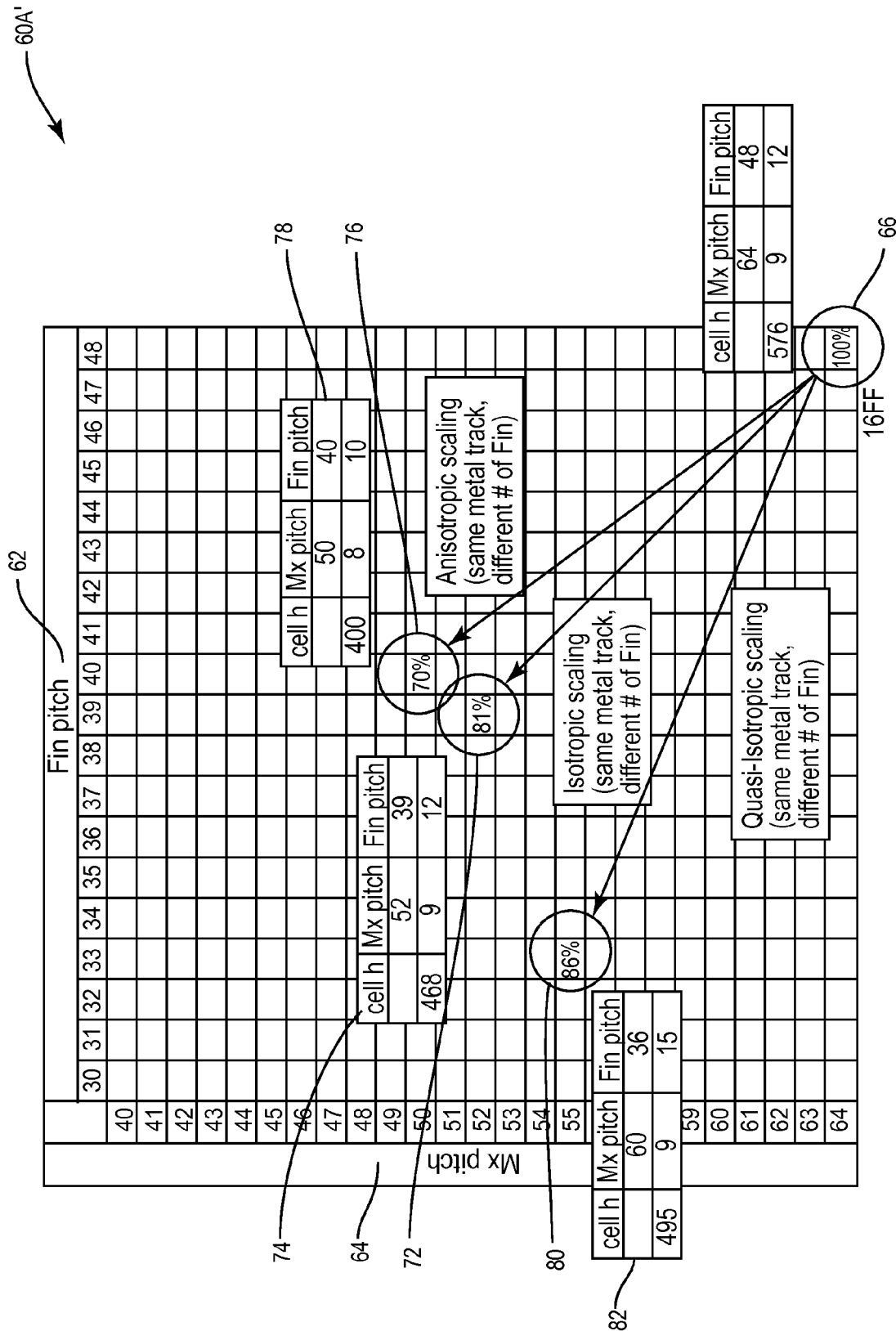
FIGS. 5A and 5B are the lookup table of FIG. 4A in use showing various alternate possibilities in FinFET design.

A first exemplary scaling exercise is provided with reference to FIG. 5A. In FIG. 5A, a partial look up table 60A' is provided with cell 66 forming the starting point. The isotropic scaling is evaluated and cell 72 is identified, which is eighty-one percent (81%) of the size of the starting point, and corresponds to a fin pitch of thirty-nine (39) nm and a metal pitch of fifty-two (52) nm. The respective pitch sizes are design characteristics. Likewise, the respective pitch sizes dictate a cell height, which in this example is 468 nm (see inset 74). Similarly, the anisotropic scaling is evaluated including cell 76 corresponding to a fin pitch of forty (40) nm and a metal pitch of fifty (50) nm. This ratio of pitches corresponds to a cell height of four hundred (400) nm (see inset 78). Another anisotropic scaling is evaluated in cell 80, which corresponds to a fin pitch of thirty-six (36) nm and a metal pitch of sixty (60) nm. This ratio of pitch sizes corresponds to a cell height of 495 nm (see inset 82). Note that the cell 80 corresponds to a quasi-isotropic scaling in that the metal pitch ratio remains nine, but the fin pitch ratio is fifteen. For the purposes of the present disclosure, quasi-isotropic scaling is defined to be within the ambit of anisotropic scaling. The designer has, in this example, three design options which are compared to the design criterion to see which best meets the design criterion. For example, manufacturing constraints may make production of a fin pitch size of thirty-six (36) nm impractical and thus, the design choice associated with cell 80 is discarded. When choosing between the design choice associated with cells 72, 76, the cell height of cell 76 may be better than the cell height of cell 72 and thus a design choice is selected. Other design criteria may dictate the choice of the new ratio.

Figure 5B:
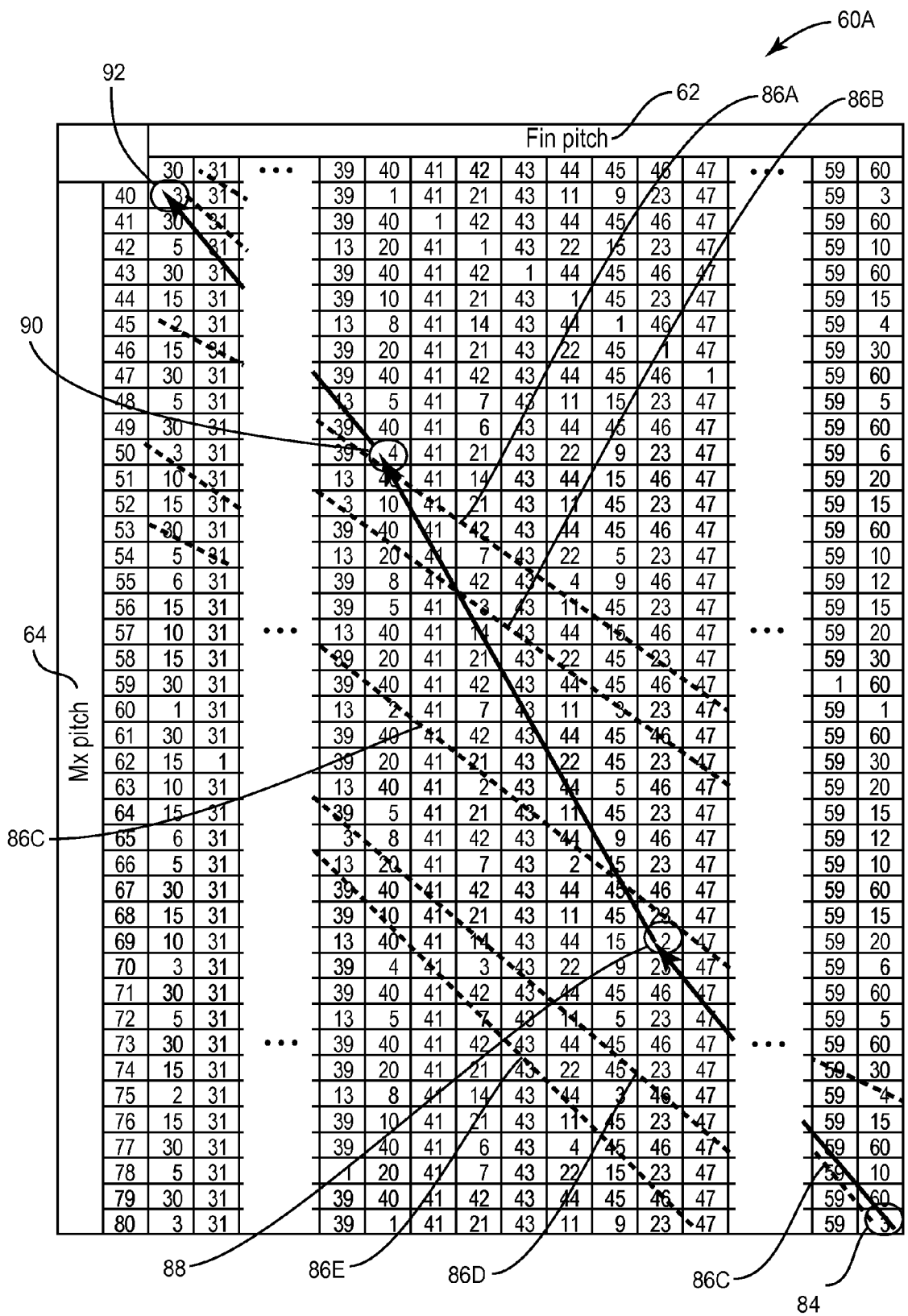

A second exemplary scaling exercise is provided with reference to FIG. 5B. The look up table 60A is reproduced with a starting cell 84. Various isotropic scaling lines 86A-86E are illustrated. Various anisotropically scaled ratios are evaluated (e.g., cells 88, 90) and at least one isotropically scaled ratio is evaluated (e.g., cell 92). Again, the process has identified three design options which are compared to the design criterion to ascertain which design option best meets the design criterion. The look up table may be used in other manners.

Figure 6:
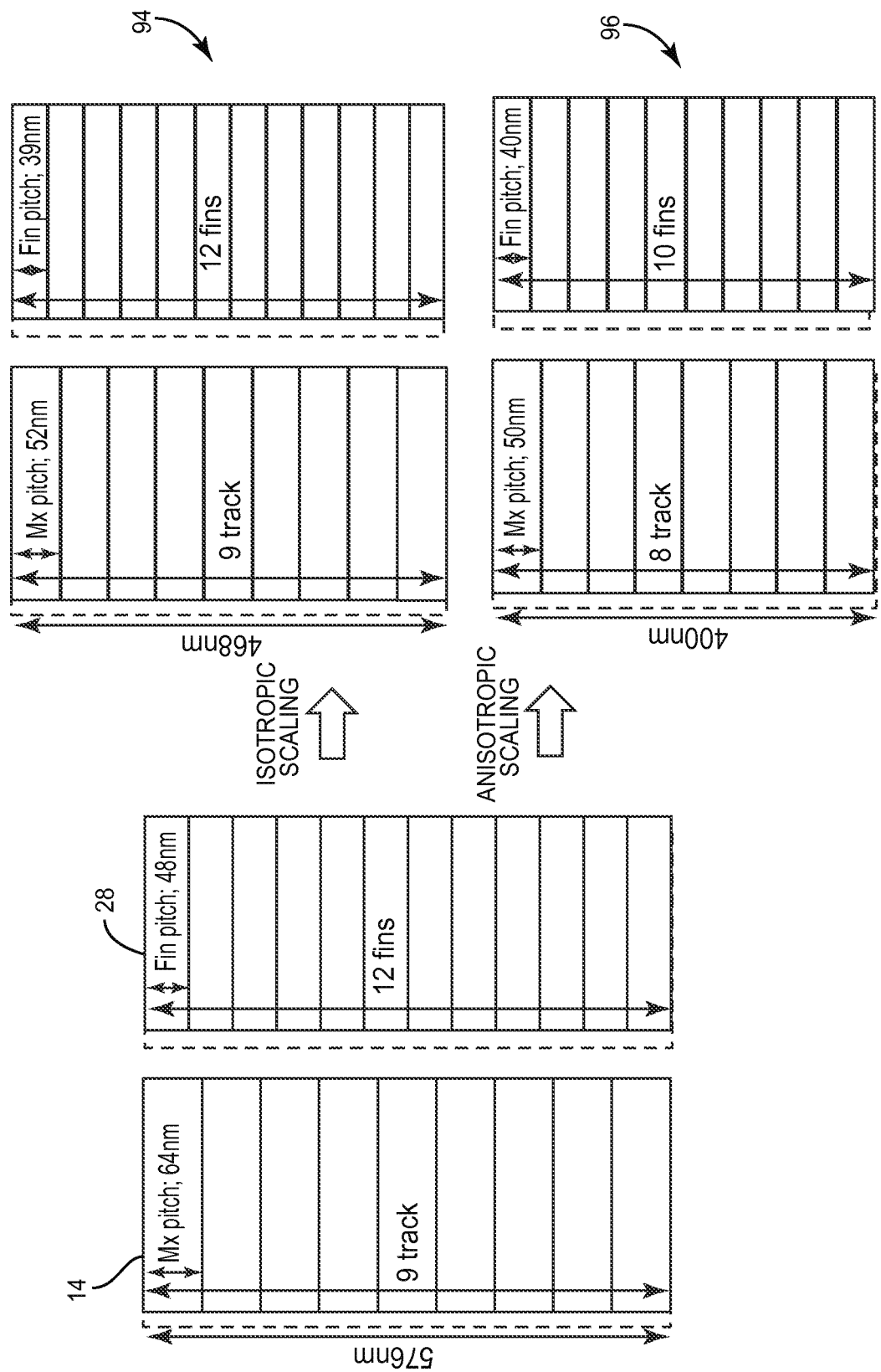
FIG. 6 illustrates a simplified schematic illustrating two alternate metal pitches relative to fin pitches in a FinFET designed according to the process of FIG. 3.

In this regard. FIG. 6 illustrates the metal layer 14 and a conceptual fin layer 28 of the starting point and two possible design options corresponding to an isotropically scaled design option 94 and an anisotropically scaled design option 96. As option 94 keeps the 9:12 ratio, but with resized metal pitch of fifty-two (52) nm and a fin pitch of thirty-nine (39) nm. In contrast to the isotropically scaled design option 94, the anisotropically scaled design option 96 has a new 8:10 ratio with a metal pitch of fifty (50) nm and a fin pitch of forty (40) nm. The designer may evaluate both design options 94, 96 to see which one better meets the design criterion.

The methods for designing FinFETs according to embodiments disclosed herein may generate FinFETs that can be provided in or integrated into any processor-based device.

Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 7:
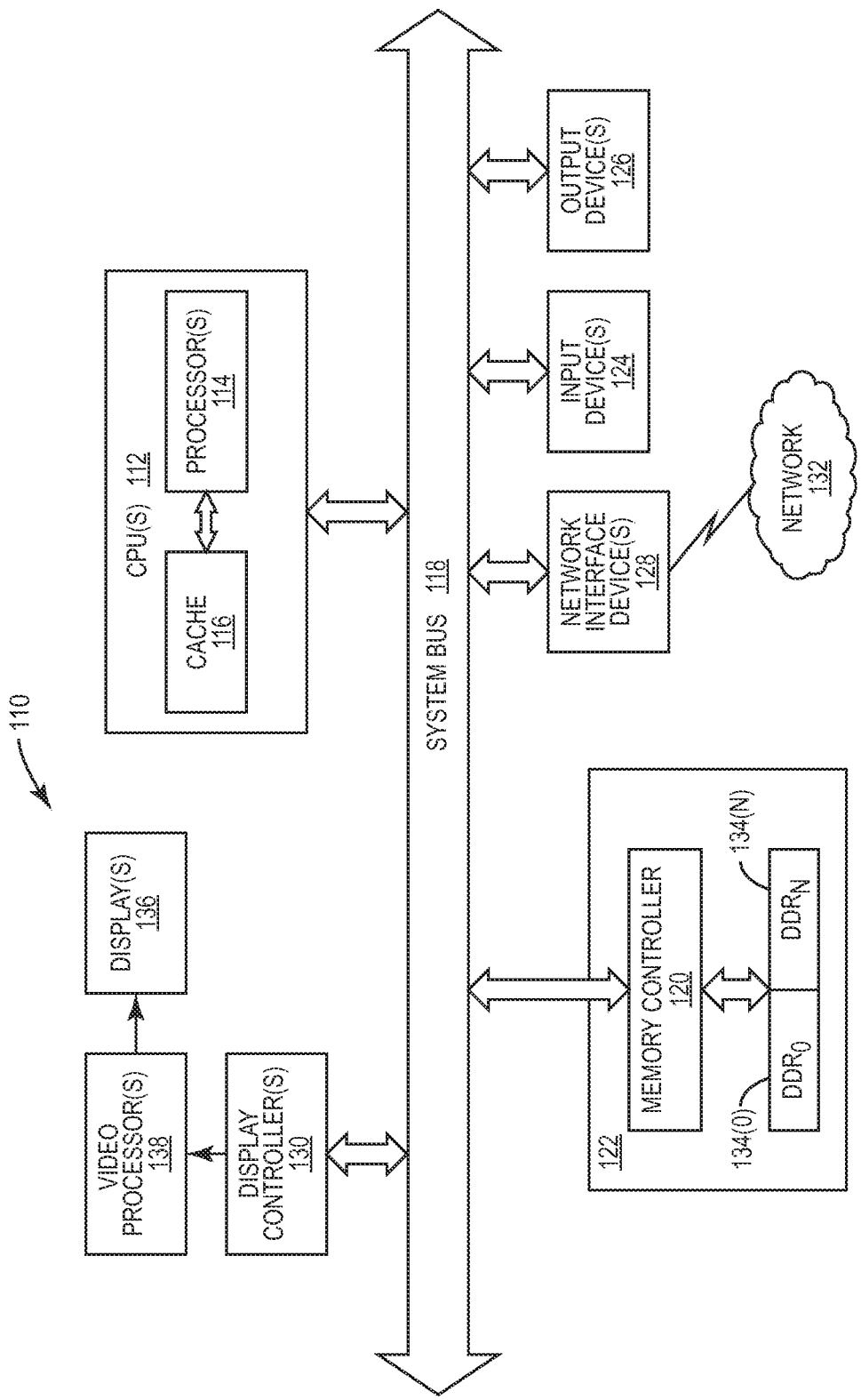
FIG. 7 is a block diagram of an exemplary processor-based system that can include the newly designed FinFET of FIG. 6.

In this regard, FIG. 7 illustrates an example of a processor-based system 110 that can employ a FinFET device made from the methods of the present disclosure. The FinFET may be incorporated in a semiconductor die in such a processor-based system. In this example, the processor-based system 110 includes one or more central processing units (CPUs) 112, each including one or more processors 114. The CPU(s) 112 may have cache memory 116 coupled to the processor(s) 114 for rapid access to temporarily stored data. The CPU(s) 112 is coupled to a system bus 118 and can intercouple master devices and slave devices included in the processor-based system 110. As is well known, the CPU(s) 112 communicates with these other devices by exchanging address, control, and data information over the system bus 118. For example, the CPU(s) 112 can communicate bus transaction requests to the memory controller 120. Although not illustrated in FIG. 7, multiple system buses 118 could be provided, wherein each system bus 118 constitutes a different fabric.

Other devices can be connected to the system bus 118. As illustrated in FIG. 7, these devices can include a memory system 122, one or more input devices 124, one or more output devices 126, one or more network interface devices 128, and one or more display controllers 130, as examples. The input device(s) 124 can include any type of input device, including but not limited to input keys, switches, voice processors, etc. The output device(s) 126 can include any type of output device, including but not limited to audio, video, other visual indicators, etc. The network interface device(s) 128 can be any devices configured to allow exchange of data to and from a network 132. The network 132 can be any type of network, including but not limited to a wired or wireless network, private or public network, a local area network (LAN), a wide local area network (WLAN), and the Internet. The network interface device(s) 128 can be configured to support any type of communication protocol desired. The memory system 122 can include one or more memory units 134(0-N).

The CPU(s) 112 may also be configured to access the display controller(s) 130 over the system bus 118 to control information sent to one or more displays 136. The display controller(s) 130 sends information to the display(s) 136 to be displayed via one or more video processors 138, which process the information to be displayed into a format suitable for the display(s) 136. The display(s) 136 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of designing a fin-based field effect transistor (FinFET), comprising:
   determining a starting point ratio between a metal pitch and a fin pitch for a starting FinFET design;
   evaluating, using a computing device, an isotropically scaled ratio for a smaller FinFET design, the isotropically scaled ratio having at least a first design characteristic;
   evaluating, using the computing device, at least one anisotropically scaled ratio for the smaller FinFET design, the at least one anisotropically scaled ratio having at least a second design characteristic;
   comparing, using the computing device, the first and second design characteristics to at least one threshold design characteristic; and
   selecting a new ratio for the FinFET based on the comparing.

2. The method of claim 1 wherein the starting point ratio is 9:12 or 3:4.

3. The method of claim 1 wherein the starting FinFET design corresponds to a sixty-four nanometer (64 nm) scale for the metal pitch.

4. The method of claim 1 wherein the starting FinFET design corresponds to a forty-eight nanometer (48 nm) scale for the fin pitch.

5. The method of claim 1 wherein the at least one threshold design characteristic is selected from the group consisting of: cell height, fin width, fin space, metal width, metal space, channel length, channel width, the metal pitch, the fin pitch, leakage current, maximum current, maximum voltage, and bias voltage.

6. The method of claim 1 wherein evaluating the isotropically scaled ratio comprises using a first look up table.

7. The method of claim 6 wherein evaluating the at least one anisotropically scaled ratio comprises using a second look up table.

8. The method of claim 7 wherein the first look up table is the same as the second look up table stored within a computer readable memory.

9. The method of claim 1 wherein the FinFET is configured to be integrated into a semiconductor die.

10. The method of claim 1 wherein the FinFET is configured to be integrated into a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

11. A method of designing a fin-based field effect transistor (FinFET), comprising:
    a step for determining a starting point ratio between a metal pitch and a fin pitch for a starting FinFET design;
    a step for evaluating, using software on a non-transitory computer readable medium, an isotropically scaled ratio for a smaller FinFET design, the isotropically scaled ratio having at least a first design characteristic;
    a step for evaluating, using the software on the non-transitory computer readable medium, at least one anisotropically scaled ratio for the smaller FinFET design, the at least one anisotropically scaled ratio having at least a second design characteristic;
    a step for comparing, using the software on the non-transitory computer readable medium, the first and second design characteristics to at least one threshold design characteristic; and
    a step for selecting a new ratio for the FinFET based on the comparing.

12. The method of claim 11 wherein the starting point ratio is 9:12.

13. The method of claim 11 wherein the starting FinFET design corresponds to a sixty-four nanometer (64 nm) scale for the metal pitch.

14. The method of claim 11 wherein the starting FinFET design corresponds to a forty-eight nanometer (48 nm) scale for the fin pitch.

15. The method of claim 11 wherein the at least one threshold design characteristic is selected from the group consisting of: the metal pitch, the fin pitch, leakage current, maximum current, maximum voltage, and bias voltage.

16. The method of claim 11 wherein evaluating the isotropically scaled ratio comprises using a first look up table.

17. The method of claim 16 wherein evaluating the at least one anisotropically scaled ratio comprises using a second look up table.

18. The method of claim 17 wherein the first look up table is the same as the second look up table stored within a computer readable memory.

19. A non-transitory computer-readable medium having stored thereon computer executable instructions to cause a processor to:
    determine a starting point ratio between a metal pitch and a fin pitch for a starting fin-based field effect transistor (FinFET) design;
    evaluate an isotropically scaled ratio for a smaller FinFET design, the isotropically scaled ratio having at least a first design characteristic;
    evaluate at least one anisotropically scaled ratio for the smaller FinFET design, the at least one anisotropically scaled ratio having at least a second design characteristic;
    compare the first and second design characteristics to at least a threshold design characteristic; and
    select a new ratio for the FinFET based on the comparing.

* * * * *